(12) United States Patent
Abbasi et al.

(10) Patent No.: US 12,174,534 B2
(45) Date of Patent: Dec. 24, 2024

(54) FAST FLUIDIC ASSEMBLY METHOD FOR NANOSCALE AND MICROSCALE PRINTING

(71) Applicant: Northeastern University, Boston, MA (US)

(72) Inventors: Salman A. Abbasi, Malden, MA (US); Zhimin Chai, Revere, MA (US); Ahmed Busnaina, Needham, MA (US)

(73) Assignee: Northeastern University, Boston, MA (US)

( * ) Notice: Subject to any disclaimer, the term of this patent is extended or adjusted under 35 U.S.C. 154(b) by 343 days.

(21) Appl. No.: 17/765,927

(22) PCT Filed: Oct. 16, 2020

(86) PCT No.: PCT/US2020/056190
§ 371 (c)(1),
(2) Date: Apr. 1, 2022

(87) PCT Pub. No.: WO2021/077045
PCT Pub. Date: Apr. 22, 2021

(65) Prior Publication Data
US 2022/0373882 A1  Nov. 24, 2022

Related U.S. Application Data

(60) Provisional application No. 62/915,966, filed on Oct. 16, 2019.

(51) Int. Cl.
*G03F 7/00* (2006.01)
*B33Y 10/00* (2015.01)
(Continued)

(52) U.S. Cl.
CPC ............ *G03F 7/0002* (2013.01); *B33Y 10/00* (2014.12); *B33Y 80/00* (2014.12); *B82Y 40/00* (2013.01)

(58) Field of Classification Search
CPC ....... G03F 7/0002; B33Y 10/00; B33Y 80/00; B82Y 40/00; H01L 21/0272; H01L 21/306; H01L 21/3105
See application file for complete search history.

(56) References Cited

U.S. PATENT DOCUMENTS

| 2010/0021744 | A1  | 1/2010  | Myerson et al. |
| 2015/0322589 | A1* | 11/2015 | Busnaina .......... H01L 21/76879 219/148 |
| 2016/0339730 | A1* | 11/2016 | Wariishi ................ B41C 1/1016 |

OTHER PUBLICATIONS

Abbasi, "Scalable Printing of High-Resolution Flexible Transparent Grid Electrodes Using Directed Assembly of Silver Nanoparticles", Abbassi et al., Adv. Mater. Interfaces 2019, 6, 1900898 (7 pages), published online Aug. 9, 2019 (Year: 2019).*

(Continued)

*Primary Examiner* — Michael G Miller
(74) *Attorney, Agent, or Firm* — Verrill Dana, LLP

(57) ABSTRACT

A scalable printing process capable of printing microscale and nanoscale features for additively manufacturing electronics is provided. This fast, directed assembly-based approach selectively prints microscale and nanoscale features on both rigid and flexible substrates. The printing speed is much faster than state-of-the-art inkjet and flexographic printing, and the resolution is two orders of magnitude higher, with minimum feature size of 100 nm. Feature patterns can be printed over large areas and require no special limitations on the assembled materials. Hydrophilic/hydrophobic patterns are used to direct deposition of nanomaterials to specific regions or to selectively assemble polymer blends to desired sites in a one-step process with high specificity and selectively. The selective deposition can be based on electrostatic forces, hydrogen bonding, or hydrophobic interactions. The methods and nanoscale patterned substrates can be used with polyelectrolytes, conduc- (Continued)

tive polymers, colloids, and nanoparticles for application in electronics, sensors, energy, medical devices, and structural materials.

19 Claims, 6 Drawing Sheets

(51) Int. Cl.
*B33Y 80/00* (2015.01)
*B82Y 40/00* (2011.01)

(56) References Cited

OTHER PUBLICATIONS

Kim, "A Self-Assembled Monolayer-Based Micropatterned Array for Controlling Cell Adhesion and Protein Adsorption", Kim et al., Biotechnology and Bioengineering, vol. 108, No. 5, May 2011, 1194-1202 (Year: 2011).*

Kim et al., "A Self-Assembled Monolayer-Based Micropatterned Array for Conrolling Cell Adhesion and Protein Adsorption", Biotechnology and Bioengineering, vol. 108, No. 5, May 2011, pp. 1194-1202.

Abbasi, S. A., "Surface Engineering Assisted Directed Assembly-based Printing of Electronic Devices", A Dissertation Presented Dec. 2019, 43 pages.

Abbasi et al., "Scalable Printing of High-Resolution Flexible Transparent Grid Electrodes Using Directed Assembly of Silver Nanoparticles", Advanced Materials Interfaces, 2019, 6, 7 pages.

* cited by examiner

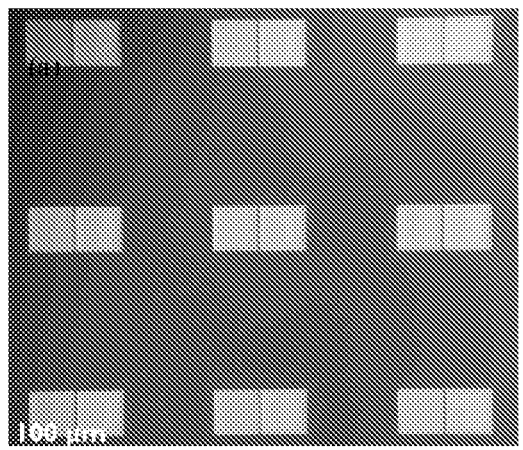
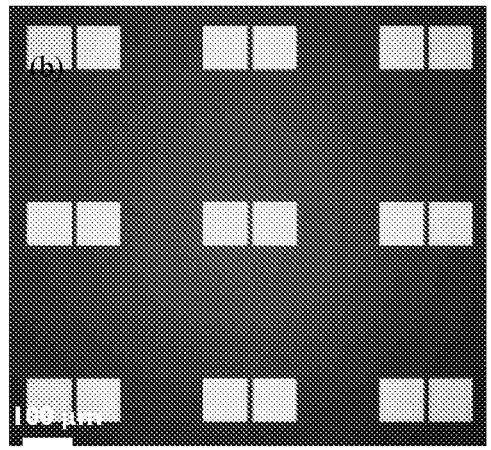
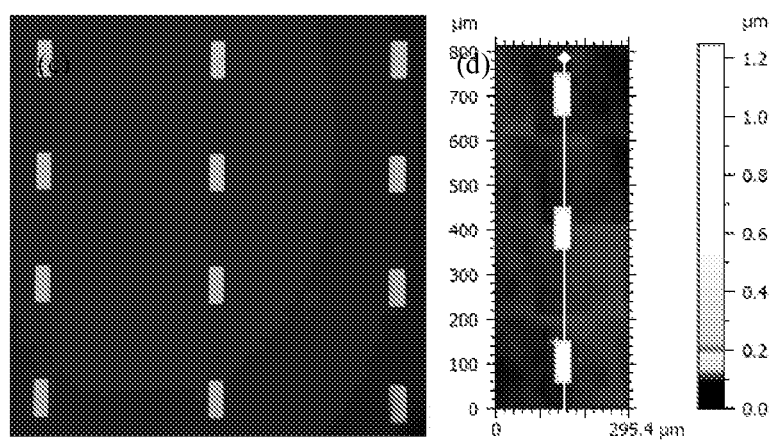
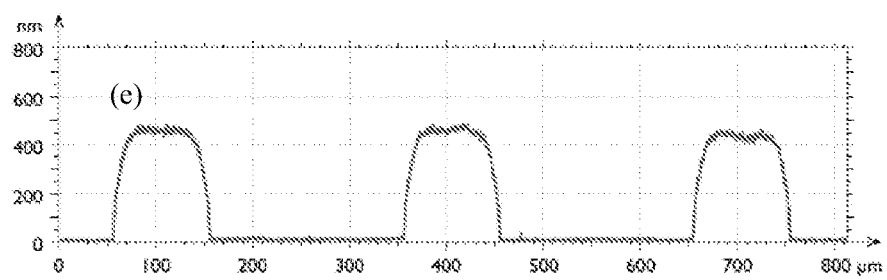
Figs. 2A – 2E

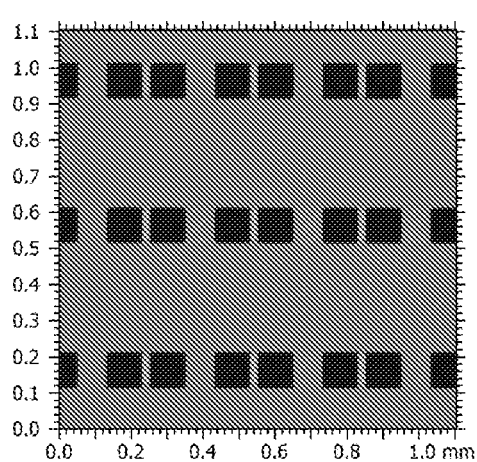 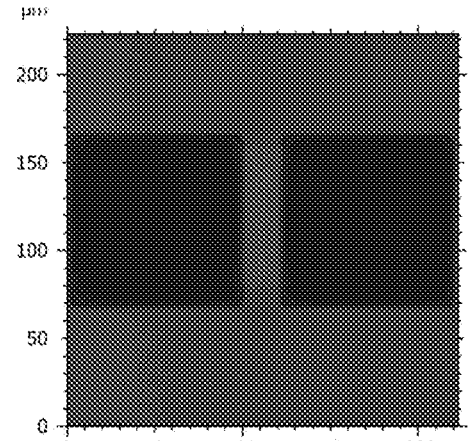
3A  3B
Figs. 3A – 3B
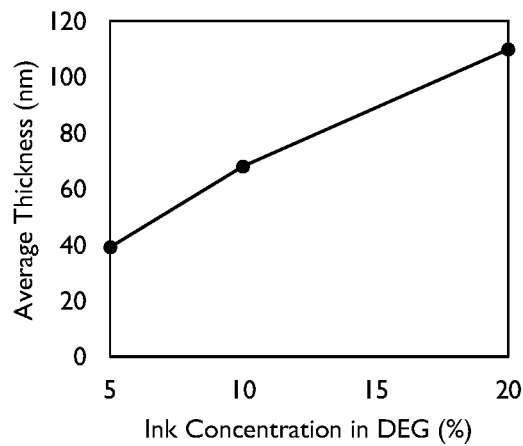 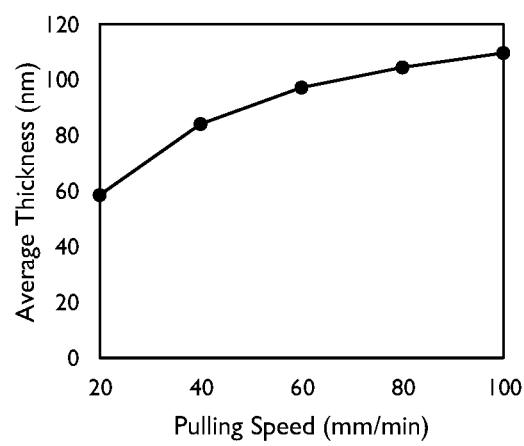
4A  4B
Figs. 4A – 4B

FAST FLUIDIC ASSEMBLY METHOD FOR NANOSCALE AND MICROSCALE PRINTING

CROSS-REFERENCE TO RELATED APPLICATIONS

This application claims the priority of U.S. Provisional Application No. 62/915,966 filed 16 Oct. 2019 and entitled "Fast Fluidic Assembly Method for Nanoscale and Microscale Printing", the whole of which is hereby incorporated by reference.

BACKGROUND

Although advanced electronics are used in every aspect of our lives today from health care, commination, energy, transportation, to AI and quantum computing, the commercial manufacturing of high performance electronic devices remains an expensive vacuum-based top down conventional process, with facilities costing over $17B and one billion dollars per year to operate. In recent years, researchers have pursued additive manufacturing of electronics to avoid the complicated and costly subtractive fabrication processes employed by the semiconductor industry. Printing of electronics is projected to cost 10-100 times less than conventional fabrication while allowing device designers the ability to use any organic or inorganic semiconducting, conductive, or insulating material on flexible or rigid substrates. To this end, several printing techniques have been adapted for printing electronics over the past two decades with inkjet printing, gravure printing, flexography, and screen printing being the most widely known.[1] However, disrupting the conventional semiconductor fabrication processing requires high-throughput printing of a variety of materials with resolution comparable to that of the conventional fabrication processes. While the aforementioned printing processes have shown promise, the smallest features they can reliably print is about 10 µm, which is comparable to the first Intel microprocessor (Intel 4004), introduced in 1970-71 with a minimum feature size of 10 µm.[2] Previously, directed assembly has been demonstrated using photoresist templating (utilizing a dipcoating process platform) to selectively print nanomaterials such as carbon nanotubes (CNTs) or nanoparticles into channels down to nanoscale using dilute suspensions.[3-7]

The directed assembly of nanomaterials using a dip-coating-based platform is a diffusion-controlled process, and therefore its use with dilute suspensions requires low withdrawal speeds that are unfeasible for the high throughput processes required for commercialization. To increase the printing speed, an electric field has been used to direct more particles towards the substrate and thereby reduce the diffusion time by increasing the local concentration of nanomaterials near the patterned feature.[9-10] This method, however, also has limitations as it requires a conductive substrate underneath the insulator and is also limited by the thickness of the oxide that can be used to print on.

The literature describes lithography-assisted selective deposition of materials.[11] Either spincoating or doctor blading are used to deposit materials.[11-12] Nanoscale templating can be achieved by utilizing electron beam lithography and directed assembly of amphiphilic polymers to engineer the surface into hydrophilic and hydrophobic regions.[13-14] An arbitrary material can then be deposited selectively by exploiting the selective hydrophobicity/hydrophilicity of the deposited layers. However, both doctor blading and spin-coating offer less control over large substrates than a dip-coating platform.

It is currently unclear whether the technical and physical constraints of previous methods will allow these methods to ever achieve resolution comparable to that of conventional silicon-based fabrication. Thus, there is a need for a high throughput, readily integrable process that can print microscale and nanoscale features with controllable thickness and width for various device applications.

SUMMARY

The present technology provides a high-throughput directed assembly-based method for printing microscale and nanoscale features on both rigid and flexible substrates. The method utilizes dip-coating without relying on diffusion effects and therefore can be operated at much higher withdrawal speeds. The method relies on fluid properties related to alternating hydrophobic and hydrophilic surfaces, and requires no applied electrical potential.

The technology can further be summarized in the following list of features.

1. A method of assembling nanoelements on a substrate to form a nanoscale or microscale pattern of nanoelements, the method comprising the steps of:
   (a) providing a suspension of nanoelements in a liquid and a substrate comprising one or more hydrophobic regions disposed on a surface of the substrate and one or more hydrophilic regions disposed between the hydrophobic regions on the surface of the substrate, the hydrophilic regions forming a nanoscale or microscale pattern;
   (b) dipping the substrate into the nanoelement suspension so that the pattern of hydrophilic regions is submerged in the suspension; and
   (c) withdrawing the substrate out of the suspension and into air or gas above the suspension at a speed that allows evaporation of the liquid but not draining of the suspension, whereby nanoelements from the suspension bind selectively to the hydrophilic regions to form said nanoscale or microscale pattern of nanoelements.
2. The method of feature 1, further comprising drying and/or annealing the assembled nanoelements after step (c).
3. The method of any of the preceding features, wherein the substrate is rigid or flexible.
4. The method of any of the preceding features, wherein the nanoelements are conducting, semi-conducting, or insulating, and wherein the nanoelements comprise inorganic or organic material.
5. The method of any of the preceding features, wherein the hydrophobic regions comprise a self-assembled monolayer of molecules, such as a silane compound, that provide a hydrophobic coating that defines the hydrophobic regions.
6. The method of any of the preceding features, wherein the hydrophilic regions are rendered hydrophilic by exposure of the substrate to an oxygen plasma.
7. The method of any of the preceding features, further comprising:
   (d) rendering one or more of the hydrophobic regions hydrophilic;
   (e) forming new hydrophobic regions on an upper surface of the substrate containing said nanoscale or microscale pattern of nanoelements, and new hydrophilic regions disposed between the new hydrophobic regions, the new hydrophilic regions forming a new nanoscale or microscale pattern; and (f) repeating steps (b) and (c) of feature 1 to form a new nanoscale or microscale pattern of nanoelements.

8. The method of feature 7, wherein step (d) comprises plasma treatment, heat treatment, or chemical treatment of the substrate.

9. The method of feature 7 or 8, wherein step (f) is performed using a nanoelement suspension that comprises nanoelements that are the same as or different from the nanoelements contained in the previously used nanoelement suspension.

10. The method of any of the preceding features, wherein the substrate comprises silicon, silicon dioxide, sapphire, or an organic polymer.

11. The method of any of the preceding features, wherein the nanoscale or microscale pattern comprises at least one feature having a dimension of less than about 1000 nm.

12. The method of any of the preceding features, wherein the withdrawal speed is in the range of about 10 mm/min to about 100 mm/min.

13. The method of any of the preceding features, wherein the hydrophilic regions have a contact angle from 0 degrees to about 10 degrees, preferably 0 to about 5 degrees, and the hydrophobic regions have a contact angle from about 90 degrees to about 120 degrees, preferably about 105 degrees.

14. The method of any of the preceding features, wherein the nanoelement suspension has a surface tension of about 60 to about 75 mN/m, preferably about 70 mN/m.

15. The method of any of the preceding features, wherein the nanoelement suspension comprises nanoelements selected from the group consisting of nanoparticles, metallic nanoparticles, polymer nanoparticles, carbon nanotubes, nanowires, and graphene.

16. The method of any of the preceding features, wherein the nanoscale or microscale pattern comprises at least one feature having a thickness from about 100 nm to about 1500 nm.

17. A device comprising a patterned nanoscale or microscale assembly of nanoelements, wherein the device is fabricated by a method comprising the method of any of the preceding features.

18. A method of preparing a patterned substrate for fast fluidic assembly of nanoelements on the substrate into a nanoscale or microscale pattern, the method comprising the steps of:

(a) treating a surface of the substrate with a plasma, whereby the surface is rendered hydrophilic or more hydrophilic;

(b) depositing a photoresist on the plasma treated surface;

(c) performing lithography such that a pattern of photoresist structures remains, said pattern of photoresist structures corresponds to said nanoscale or microscale pattern;

(d) forming a patterned hydrophobic coating in areas between the photoresist structures remaining after step (c);

(e) removing the photoresist structures, leaving hydrophilic regions between areas of hydrophobic coating, thereby forming said patterned substrate.

19. The method of feature 18, wherein the pattern of hydrophobic coating is formed in step (d) by forming a self-assembled monolayer of molecules, such as a silane compound, that provide hydrophobicity to the hydrophobic coating.

20. The method of feature 19, further comprising performing the method of any of features 1-16 to form a nanoscale or microscale pattern of assembled nanoelements on the patterned substrate.

21. A patterned substrate for use in fast fluidic assembly of nanoelements, wherein the patterned substrate is obtainable by the method of any of features 18-20.

22. The patterned substrate of feature 21, further comprising a patterned assembly of nanoelements.

23. A method of preparing a patterned substrate for fast fluidic assembly of nanoelements on the substrate into a nanoscale or microscale pattern, the method comprising the steps of:

(a) treating a surface of the substrate with a plasma, whereby the surface is rendered hydrophilic or more hydrophilic;

(b) depositing a photoresist on the plasma treated surface;

(c) performing lithography such that one or more photoresist structures remain, wherein the space between the photoresist structures forms said nanoscale or microscale pattern;

wherein the photoresist structures are not removed prior to assembly of nanoelements on the patterned substrate.

24. The method of feature 23, further comprising performing the method of any of features 1-16 to form a nanoscale or microscale pattern of assembled nanoelements on the patterned substrate.

25. The method of feature 24, wherein the nanoelement suspension does not contain a solvent that degrades or solubilizes the photoresist structures.

26. The method of feature 25, wherein the nanoelement suspension comprises nanoelements suspended in a solvent comprising or consisting of water, an alcohol, a water-miscible solvent, or a combination thereof.

BRIEF DESCRIPTION OF DRAWINGS

FIGS. 2A-2E show printed silver nanoparticles on different surfaces and in different feature sizes. FIG. 2A shows silver printed in 100 µm×100 µm pads with a 2 µm spacing on a Si substrate. FIG. 2B shows the same silver pads with a 10 µm spacing printed on a 300 nm layer of $SiO_2$ on Si. FIG. 2C shows silver printed in a 40 µm×100 µm channel on $SiO_2$ at 100 mm/min using a 20 wt % silver ink in isopropyl alcohol (IPA) and diethylene glycol (DEG). FIGS. 2D and 2E show the cross-sectional profile of the channel printed in FIG. 2C, captured using a confocal microscope.

FIGS. 3A-3B demonstrate the ability to print on a preexisting layer. Silver nanoparticles were printed using the draining domain on top of a metal channel deposited using the evaporation domain. FIG. 3B shows an enlarged view of a portion of FIG. 3A.

FIG. 4A shows the effect of increasing nanoparticle concentration on the printed film thickness on a Si substrate. The effect of varying pulling speed on the thickness of the printed feature for a fixed concentration of ink (20 wt % Ag in DEG) on Si is shown in FIG. 4B.

FIG. 6A shows printed gallium nitride nanoparticles, and FIG. 6B shows printed carbon nanotubes; both materials were printed onto a $SiO_2$ surface using a fast fluidic assembly process.

FIG. 8 demonstrates the use of fast fluidic assembly-based printing to print nanoscale features. The figure shows scanning electron micrographs of 400 nm wide printed silver lines before annealing, demonstrating the ability to print nanoscale patterns.

DETAILED DESCRIPTION

Figure 1A:
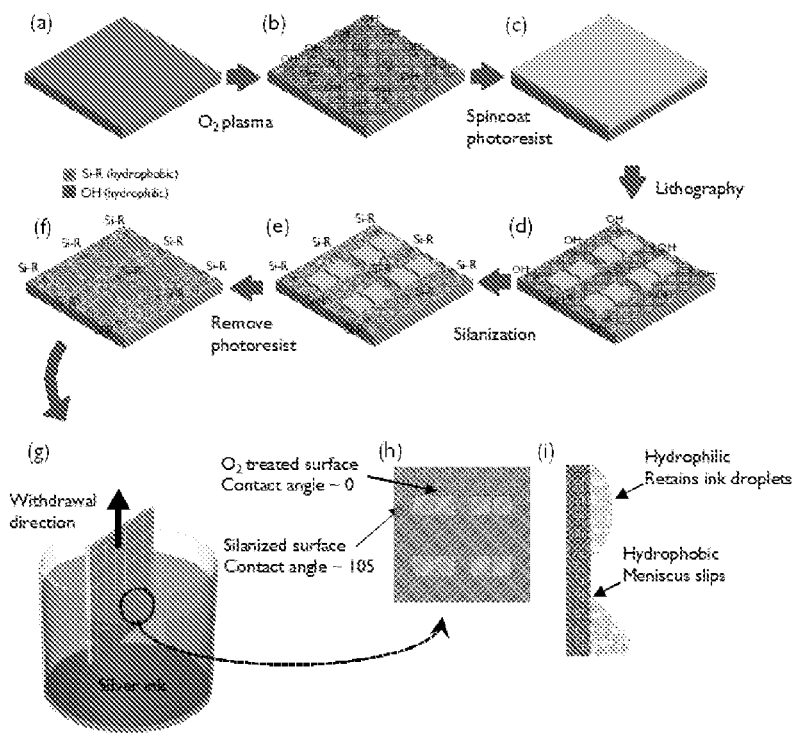
FIG. 1A schematically shows substrate preparation for a fast fluidic assembly process. Parts (a) through (f) illustrate the substrate fabrication process, and part (g) illustrates the fast fluidic assembly-based printing process. The mechanism is based on the difference in wettability of hydrophobic and hydrophilic regions, as represented in parts (h) and (i).
Figure 1B:
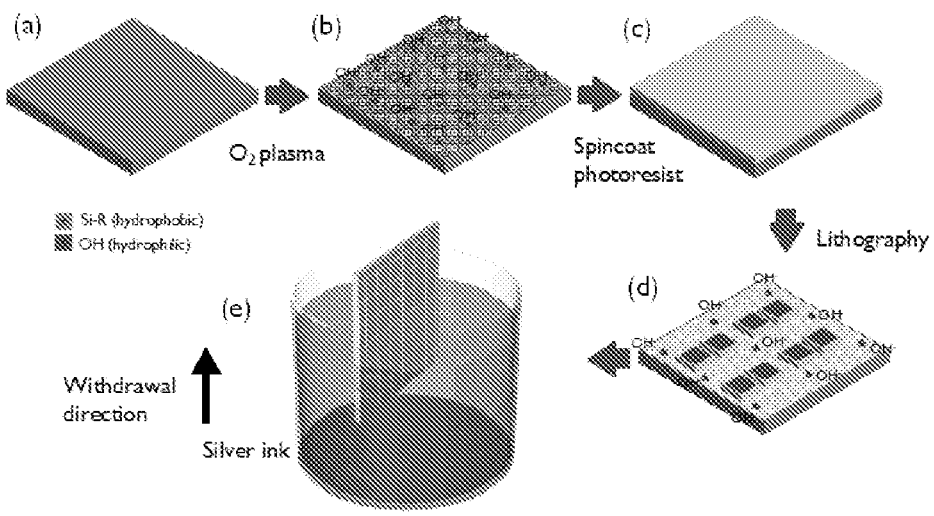
FIG. 1B is a schematic illustration of another process for preparing a substrate suitable for use in a fast fluidic assembly process, which avoids the need for photoresist removal and silanization. Parts (a) through (c) are the same as for the method of FIG. 1A. Part (d) depicts the substrate after lithography; note that the photoresist pattern is the negative image compared to that in FIG. 1A, part (d). The process omits the silanization and photoresist removal steps (parts (e) and (f) of FIG. 1A) resulting in a faster process.

The present technology provides a high-throughput directed assembly-based approach that selectively prints microscale and nanoscale features on both rigid and flexible substrates. The directed assembly-based printing described here utilizes a dip-coating-based platform where diffusion effects have been eliminated, and therefore its use allows it to operate at much higher withdrawal speeds that enable high throughput processes required for commercialization. The method relies on fluid properties related to alternating hydrophobic and hydrophilic surfaces, and requires no applied electrical potential.

The dip-coating assembly process can operate in two different regimes depending on the withdrawal speed: evaporative and draining regimes.[8] The evaporative regime is active when the withdrawal rate speed is slow, typically less than 10 mm/min using aqueous suspensions, and the thickness of the deposited film decreases with increasing withdrawal speed. At a certain withdrawal speed, the dip-coating process enters the draining regime, where the thickness of printed features is seen to increase with increasing withdrawal speed. Higher withdrawal speeds can be employed with more concentrated inks, albeit at the cost of reduced selectivity, which is typically undesirable for a printing process.

The directed assembly-based printing process of the present technology utilizes dip-coating with surface engineering to selectively print on a variety of rigid surfaces, such as Si, $SiO_2$, sapphire, glass, or quartz, or on flexible substrates such as those containing or made entirely from one or more organic polymers. The process has been shown to print conductive, semiconducting, and insulating materials from 100 μm down to sub 100 nm scale at a high speed 100 mm/min or faster. The thickness and the morphology of the film can be tailored by controlling the pulling speed and modulating solvent properties such as surface tension, concentration of nanomaterials, viscosity, and/or volatility.

The use of a dip-coating platform to accomplish the assembly-based printing is significantly different from spin-coating, spray-coating, and doctor blading. There are two major disadvantages of spin-coating. First, the film thickness varies from the center to the edge of the substrate. Second, spin-coating is not a material conservative technique, as a significant amount of material slips off the substrate. For printing, it is especially disadvantageous, as the nanoparticle inks that are used for printing electronics are expensive. The doctor blading process has serious limitations, such as inhomogeneity over large substrates and difficulty in attaining features heights of less than 100 nm. Moreover, the only previously demonstrated doctor blading on an engineered surface was done using an organic polymer, not a nanoparticle suspension. The doctor blading process, similar to spin-coating and spray-coating, is not a material conservative process, and the excess ink is often wasted.

Fluidic assembly of nanomaterials is typically achieved by withdrawing the substrate out of a desired ink at a fixed speed through a dip-coating platform. Depending on the withdrawal speed, dip-coating operates in either the evaporative or the draining regime. The evaporative regime is active when the withdrawal rate speed is slow, typically less than 10 mm/min, and the thickness of the deposited film decreases with increasing withdrawal speed. Use of the dip-coating method operating in the evaporative regime to selectively print carbon nanotubes (CNTs) and silver nanoparticles on photoresist templated on hydrophilic surfaces has been previously reported.[3, 5] The present technology uses dip-coating in the draining regime, not in the evaporative regime.

When using a photoresist template (patterned photoresist on a substrate), selectivity is achieved via difference in surface energies of the photoresist and plasma or piranha treated substrate. Plasma treatment increases the surface energy (i.e., increases surface hydrophilicity) by breaking bonds on the surface of the substrate. The hydrophilic regions of the substrate should have a low contact angle, such 0 to about 5 degrees, 0 to about 10 degrees, or 0 to about 20 degrees. In contrast, the photoresist typically has a low surface energy (i.e., has low surface hydrophilicity, or high surface hydrophobicity). The hydrophobic regions of the substrate should have a high contact angle, such greater than about 80 degrees, greater than about 90 degrees, or greater than about 100 degrees, or about 80 degrees to about 130 degrees, about 90 degrees to about 120 degrees, or about 100 degrees to about 110 degrees, or about 105 degrees.

With sufficiently high withdrawal speed the dip-coating process enters the draining regime, where the thickness of printed features increases with increasing withdrawal speed. Higher withdrawal speeds can be employed with more concentrated inks on a photoresist templated substrate, although higher withdrawal speed can reduce selectivity, which is undesirable for a printing process. Moreover, photoresist templated substrates cannot be used with solvent-based inks if the solvent solubilizes the photoresist. To avoid these drawbacks while increasing the speed of fluidic assembly, the present fast fluidic assembly based printing technique employs a surface that is engineered such that the features desired to be printed are made hydrophilic (high surface energy), whereas the rest of the surface is hydrophobic (low surface energy) due to the presence of a self-assembled monolayer (SAM) of a silane compound, or the presence of photoresist or another hydrophobic material. The SAM serves a function similar to that of the photoresist in methods using a patterned photoresist, but can overcome disadvantages of using a photoresist. The liquid nanoelement suspension (ink) slips off the low-energy hydrophobic surfaces under the influence of gravity and convection, while the hydrophilic areas retain ink with remarkable precision. The ink then dries, leaving the suspended particles assembled as features.

The fast fluidic assembly-based printing approach described here utilizes a dip-coating platform and surface engineered substrates to selectively print on a variety of rigid surfaces, including Si, $SiO_2$, sapphire, glass, quartz, and other substrates that are hydrophilic or can be made hydrophilic, and which can accept a patterned SAM that renders selected areas hydrophobic. A lithographically patterned surface can be printed with conductive, semiconducting, and insulating materials from 100 µm or larger down to 100 nm or smaller scale at a high speed. The thickness and the morphology of the film can be tailored by changing the pulling speed and modulating solvent properties, such as surface tension, nanomaterial concentration, and/or viscosity, and its effect on the resultant printed structures. Several factors including the properties of the surface to be printed, the concentration, viscosity and surface tension of the particle suspension (or ink), as well as the pulling (or withdrawal) speed, temperature and humidity of the surrounding environment affect the thickness and the morphology of the dip coated film have been investigated.

The present technology provides a method of preparing a patterned substrate for the fast fluidic assembly of nanoelements on the substrate into a nanoscale or microscale pattern. A surface of the substrate is treated with a plasma, whereby the surface is rendered hydrophilic or more hydrophilic. Then, a photoresist is deposited on the plasma treated surface to permit the creation of a patterned mask to block the attachment of hydrophobic moieties to be added later. Lithography is then performed using standard methods for making nanoscale or microscale features, leaving a pattern of photoresist structures on the substrate. For example, photolithography, UV lithography, or electron beam lithography can be used. The pattern of photoresist structures corresponds to the nanoscale or microscale pattern to be occupied by nanoelements after assembly. A patterned hydrophobic coating is then added in areas between the photoresist structures remaining after lithography. The patterned hydrophobic coating can be formed by adding a self-assembled monolayer (SAM) to the spaces between the photoresist structures. The SAM can be formed, for example, by allowing a silane compound to react with exposed areas of a suitably reactive substrate such as silicon dioxide or quartz. The length of the hydrocarbon chain on the silane compound can be varied, e.g., from 2 carbons to 20 carbons, so that the contact angle of the hydrophobic regions can be adjusted to a desired value. The photoresist structures are then removed, such as by dissolving them in solvent, leaving hydrophilic regions (exposed plasma treated substrate surface) between areas of hydrophobic coating. In this form, the patterned substrate is ready for the addition of nanoelements by the fast flow assembly dip-coating process.

The present technology further provides a method of assembling or printing nanoelements onto a pre-patterned substrate, such as one produced by the method described above, using a fast fluidic assembly dip-coating method to form nanoscale or microscale patterned features comprising the nanoelements. A nanoelement suspension and the pre-patterned substrate are provided for carrying out the method. The substrate contains hydrophobic regions disposed on a surface of the substrate and hydrophilic regions disposed between the hydrophobic regions on the surface of the substrate. The hydrophilic regions form the nanoscale or microscale pattern where the nanoelements are to be deposited. The substrate is dipped into the nanoelement suspension so that the pattern of hydrophilic regions is fully submerged in the suspension. The substrate is then withdrawn from the suspension slowly using a dip-coating apparatus capable of automated, steady withdrawal at speeds at least in the range from about 10 mm/min to about 100 mm/min. The substrate is withdrawn through the air-solvent or air-water interface at the surface of the suspension and into air above the suspension at a speed of at least about 10 mm/min. The speed of withdrawal is fast enough to ensure that most of the suspension drains off the substrate (i.e., in the draining regime), leaving a film of the suspension selectively adhering to the hydrophilic regions on the substrate, while rapidly draining off the hydrophobic regions occupied by the SAM. The speed of withdrawal is fast enough to prevent significant evaporation of solvent or water from the suspension and not so fast as to allow nonselective deposition of the nanoelement suspension over the hydrophobic areas of the substrate. The process results in nanoelements from the suspension binding selectively to the hydrophilic regions to form a nanoscale or microscale pattern of nanoelements.

The solvent or liquid phase of the nanoelement suspension can be selected so that it has a surface tension high enough to allow wetting of the hydrophilic regions of the substrate and formation of a thin film of the suspension from which solvent can evaporate. Water is a preferred solvent for the nanoelement suspension. Other polar solvents also can be used, such as DEG, alcohols, and other solvents or mixtures of solvents that are miscible with water. The liquid phase of the nanoelement suspension preferably has a surface tension similar to that of water (72.8 mN/m), or about 60, 65, 70, or 75 mN/m, or about 60-75 nN/m, or about 70 or about 72 mN/m.

The fast fluidic assembly process using dip-coating on an engineered surface is advantageous because it can assemble a wide variety of different nanoelements, on a wide variety of different substrates, and can be carried out rapidly under ambient conditions (room temperature and atmospheric pressure). The process can be optimized by varying not only the withdrawal speed, but also the nanoelement concentration, temperature, viscosity, humidity of air above the suspension, and surface tension. When using water-based nanoelement suspensions, a pulling speed of greater than 10 mm/min can be used at room temperature, and will result in operation in the draining mode, because the aqueous suspension drains away before any significant evaporation occurs. However, when a more volatile solvent is used in the nanoelement suspension, such as chloroform, a higher pulling speed such as greater than 30 mm/min can be used to obtain draining with little or no evaporation. It should be noted that previous methods using photoresist for patterning of nanoelement deposition cannot be used with the high withdrawal speeds used for the present technology because such high speeds result in nanoparticle deposition everywhere on the wafer, including on the photoresist, necessitating the removal of the resist (lift off) to obtain a pattern.

A variety of nanoparticle "inks" can be used with the method. For example, water-based ZnO nanoparticle ink, as well as isopropyl alcohol based and diethylene glycol based Ag nanoparticle inks have been used successfully. The present technology is compatible with a wider variety of solvents than previous methods that used photoresist to pattern nanoelement deposition, since photoresists are sensitive to many solvents. Nanoparticle concentration in the ink can be, for example, from about 5 wt % to about 30 wt %. When the nanoparticle concentration is decreased, the pulling speed should be increased, because a thicker film of the suspension needs to adhere to the hydrophilic regions so as to provide the same amount of deposited nanoelements.

After the first layer is printed, second and further layers of patterned nanoelements can be added. Methods such as chemical, thermal or plasma treatment may be used to remove the existing SAM and prepare the surface for another layer. For example, a very short exposure to Ar or O2 plasma or heating the substrate to a few hundred degrees Celsius can remove the SAM. The cycle can then be repeated by applying another layer of photoresist, patterning by lithography, removal of the photoresist, and performing another dipcoating process to add different structures containing the same or different nanoelements as deposited in the previous layer. Several such cycles can be performed, each adding a different material, for example.

Example 1. Fast Fluidic Assembly of Silver Nanoparticles With Silanization and Photoresist Removal Lithography was used to selectively functionalize surfaces according to known methods. Each substrate used for printing was piranha cleaned ($H_2SO_4$: $H_2O_2$) and treated with oxygen plasma for 2 min at 38 mTorr, 115 W, 15 sccms. Negative tone AZ N2020 was spin-coated on the wafer and patterned using UV-lithography to create a photoresist mask, which protected the desired features from the subsequent surface treatment. After lithography, the wafer was again treated with $O_2$ plasma for 1 min (115 W, 15 sccms). The substrate was then vapor treated with a silane (1H,1H,2H,2H-perfluorododecyltrichlorosilane) compound, which formed a self-assembled monolayer causing the surface energy to decrease significantly. After SAM deposition, the substrates were immersed in a solvent or photoresist stripper (e.g., acetone or NMP) to remove the photoresist mask. FIG. 1A schematically shows the substrate preparation process. The fast fluidic assembly-based printing process is demonstrated in FIG. 1A, parts (f) and (g), while the mechanism based on the difference in wettability of the hydrophobic and hydrophilic regions is visually explained in FIG. 1A parts (h) and (i).

The results presented herein were obtained using a commercially available silver nanoparticle ink. The nanoparticle suspension (ink) contained silver nanoparticles suspended in DEG, adjusted to a concentration of 20% nanoparticles by weight by adding additional DEG. The ink was utilized to print microscale features. Each substrate was lowered vertically into a bath containing the silver ink and withdrawn at a fast fixed speed. The withdrawal speed was varied from 10 mm/min to 100 mm/min to gauge the effect of withdrawal speed on the printed film's morphology and thickness. Different concentrations of the ink were also tried to measure how ink concentration affects the thickness of the printed features.

FIGS. 2A-2E show printed silver nanoparticles on different surfaces and in different feature sizes. FIG. 2A shows silver printed in 100 μm×100 μm pads with a 2 μm spacing on Si. The same pads with a 10 μm spacing printed on a 300 nm layer of $SiO_2$ on Si. FIG. 2C depicts silver printed in a 40 μm×100 μm channel on $SiO_2$ at 100 mm/min using a 20 wt % silver ink in IPA and DEG, while FIGS. 2D and 2E show the cross-sectional profile of the channel printed in FIG. 2C captured using a confocal microscope.

FIG. 3 demonstrates the ability to print on a preexisting layer. Silver nanoparticles were printed using the draining domain on top of a metal channel deposited using the evaporation domain.

FIG. 4A shows the effect of increasing nanoparticle concentration on the printed film thickness on Si. The effect of varying pulling speed on the thickness of the printed feature for a fixed concentration of ink (20 wt % Ag in DEG) on Si is shown in FIG. 4B.

Figure 5:
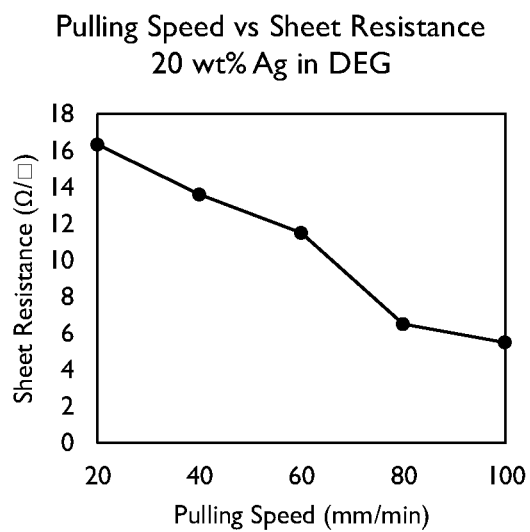
FIG. 5 shows the effect of pulling speed on the sheet resistance of printed silver.

The sheet resistance of the printed structures was also measured to demonstrate the effect of the pulling speed on the electrical properties of the printed structures. FIG. 5 shows the effect of pulling speed on the sheet resistance of printed silver.

Figure 6A:
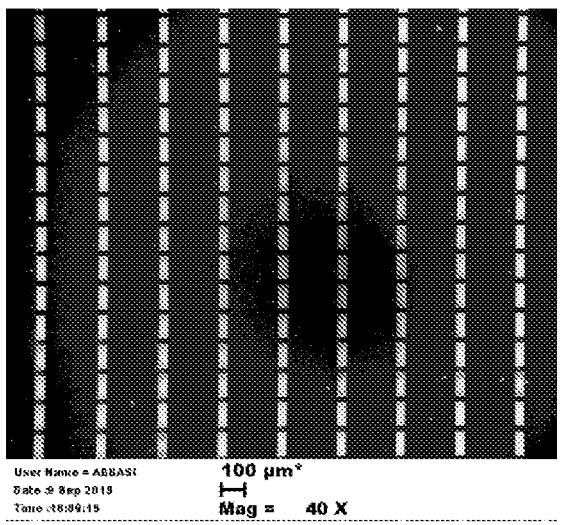
FIGS. 6A and 6B demonstrate the ability to print diverse type of nanomaterials.
Figure 6B:
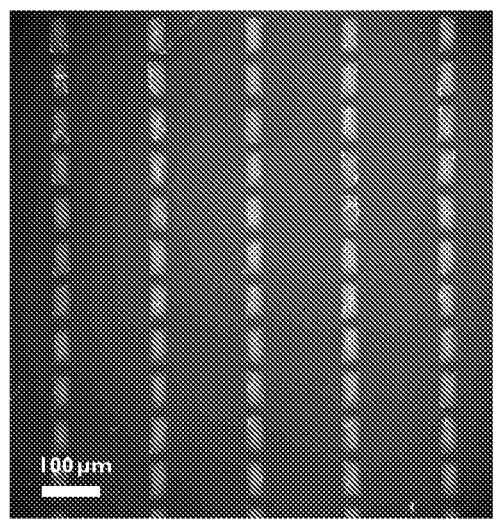

The ability to print a diverse type of materials is demonstrated in FIGS. 6A and 6B. FIG. 6A shows printing of gallium nitride and FIG. 6B shows printing of carbon nanotubes, both printed on $SiO_2$ using the described process.

Figure 7:
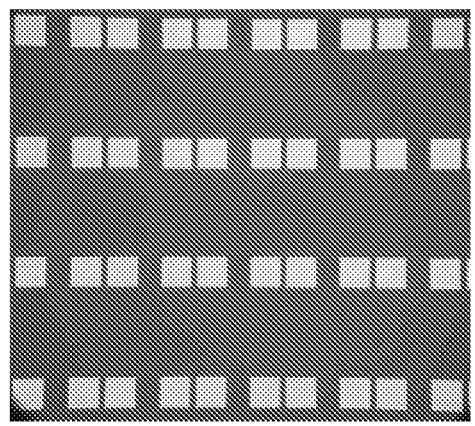
FIG. 7 shows silver nanoparticles that were first printed onto a rigid Si substrate using a fast fluidic assembly process and subsequently transfer printed, with application of heat and pressure, onto a flexible polyethylene terephthalate (PET) substrate, forming 100 μm×100 μm pads with a 2 μm spacing.

The presented fast fluidic assembly-based printing using a dipcoating platform also presents a high-throughput pathway to print flexible circuits and sensors. The particle ink assembled on a rigid substrate such as Si can be transfer printed onto polymer substrates by application of heat and pressure. FIG. 7 shows silver nanoparticles transfer printed onto a flexible polyethylene terephthalate (PET) substrate, forming 100 μm×100 μm pads with a 2 μm spacing.

Figures 8A, 8B:
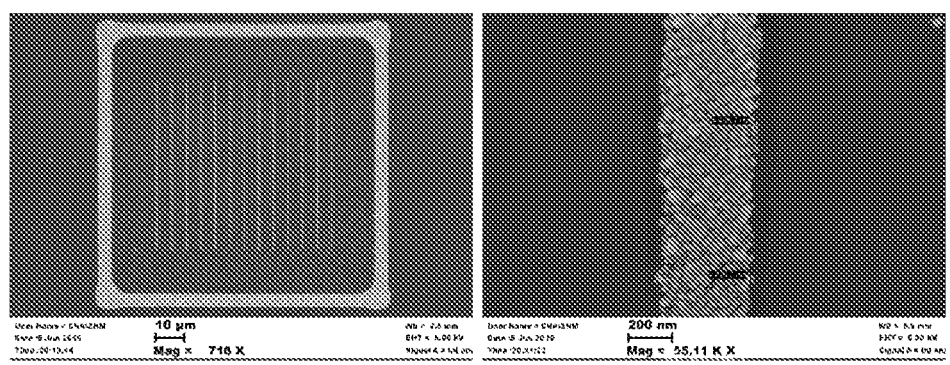
FIG. 8B shows a high magnification image of a single line from FIG. 8A.

The fast fluidic assembly-based printing was used to print nanoscale features. FIG. 8 shows 400 nm wide printed silver lines before annealing, demonstrating the ability to print nanoscale patterns.

Figure 9A:
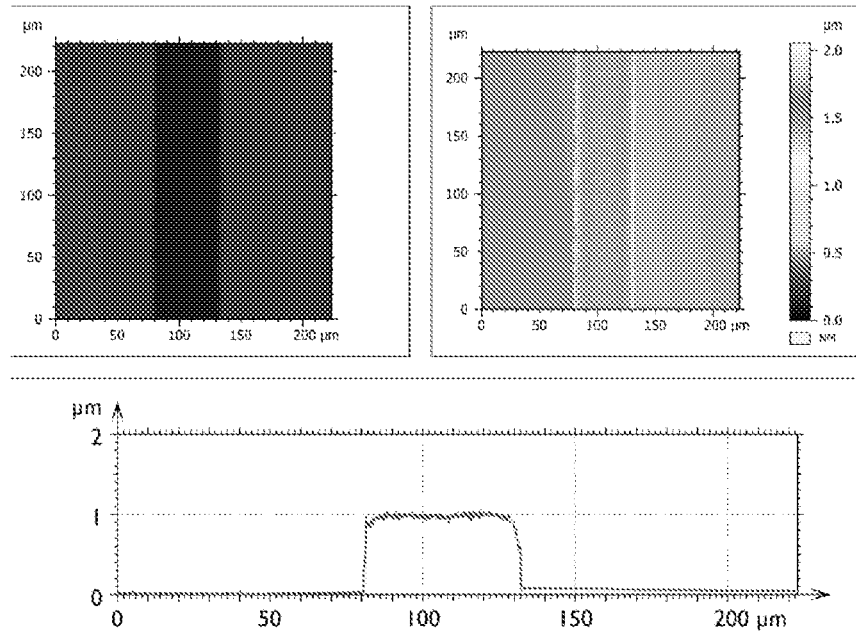
FIGS. 9A and 9B show linear CuO nanoparticle features assembled by fast fluidic assembly using a patterned photoresist on a silicon substrate. For each figure, the upper left panel shows a micrograph, while the remainder depicts the line thickness determination.
Figure 9B:
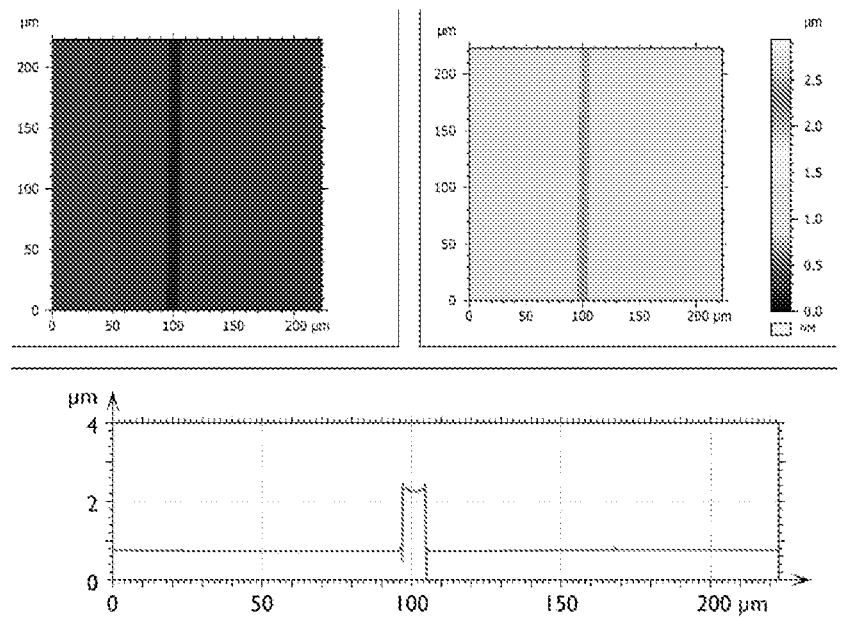

Example 2. Fast Fluidic Assembly of Silver Nanoparticles Without Photoresist Removal Silicon substrates were coated with S1813 photoresist at a thickness of 1.3 microns. Lithography was used to remove linear channels in the photoresist, either 10 microns or 50 microns wide. With the patterned photoresist remaining in place, the substrates were then dipcoated using a suspension containing 16 wt % of CuO nanoparticles (Novacentrix), using a withdrawal speed of 100 mm/min. The line thicknesses for the deposited CuO lines were determined as shown in FIGS. 9A, 9B. The line thicknesses correlated well to the thickness of the photoresist layer (1.6 microns for 10 micron width, FIG. 9A; 1.3 microns for 50 micron width, FIG. 9B).

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with the alternative expressions "consisting essentially of" or "consisting of". The term "about" can include values within 10%, 5%, 2%, 1%, or 0.5% of the stated value.

REFERENCES

1. Perelaer, J.; Smith, P. J.; Mager, D.; Soltman, D.; Volkman, S. K.; Subramanian, V.; Korvink, J. G.; Schubert, U. S., Printed electronics: the challenges involved in printing devices, interconnects, and contacts based on inorganic materials. *Journal of Materials Chemistry* 2010, 20 (39), 8446-8453.
2. Kim, S.; Sojoudi, H.; Zhao, H.; Mariappan, D.; McKinley, G. H.; Gleason, K. K.; Hart, A. J., Ultrathin high-resolution flexographic printing using nanoporous stamps. *Science Advances* 2016, 2 (12), e1601660.
3. Jaber-Ansari, L.; Hahm, M.; Kim, T.; Somu, S.; Busnaina, A.; Jung, Y., Large scale highly organized single-walled carbon nanotube networks for electrical devices. *Materials Science & Processing* 2009, 96 (2), 373-377.
4. Somu, S.; Wang, H.; Kim, Y.; Jaberansari, L.; Hahm, M. G.; Li, B.; Kim, T.; Xiong, X.; Jung, Y. J.; Upmanyu, M.; Busnaina, A., Topological Transitions in Carbon Nanotube Networks via Nanoscale Confinement. *ACS Nano* 2010, 4 (7), 4142-4148.
5. Abbasi, S. A.; Chai, Z.; Busnaina, A., Scalable Printing of High-Resolution Flexible Transparent Grid Electrodes Using Directed Assembly of Silver Nanoparticles. *Advanced Materials Interfaces* 2019, 0 (0), 1900898.
6. Xiong, X.; Jaberansari, L.; Busnaina, A.; Jung, Y. J.; Somu, S.; Upmanyu, M. Highly Organized Single-Walled Carbon Nanotube Networks and Method of Making Using Template Guided Fluidic Assembly. US2010183844 (A1), 2010/07/22/, 2010.
7. Sirman, A.; Halder, A.; Busnaina, A. Nanoelement Assembly at a Polar-Nonpolar Solvent Interface. WO2016094384 (A2), 2016/06/16/, 2016.
8. Brinker, C. J., Dip coating. In *Chemical Solution Deposition of Functional Oxide Thin Films*, Springer: 2013; pp 233-261.
9. Yilmaz, C.; Sirman, A.; Halder, A.; Busnaina, A., High-Rate Assembly of Nanomaterials on Insulating Surfaces Using Electro-Fluidic Directed Assembly. *ACS Nano* 2017, 11 (8), 7679-7689.
10. Sirman, A.; Busnaina, A.; Yilmaz, C.; Huang, J.; Somu, S. High Rate Electric Field Driven Nanoelement Assembly on an Insulated Surface. US2019211467 (A1), 2019/07/11/, 2019.
11. Lee, K.-H.; Choi, B.-Y.; Park, J.-W.; Kang, S.-J.; Kim, S.-M.; Kim, D.-Y.; Jung, G.-Y., Solution processable micron- to nanoscale conducting polymer patterning utilizing selective surface energy engineering. *Organic Electronics* 2010, 11 (5), 748-754.
12. Lee, K.-H.; Kim, S.-M.; Jeong, H.; Jung, G.-Y., Spontaneous nanoscale polymer solution patterning using solvent evaporation driven double-dewetting edge lithography. *Soft Matter* 2012, 8 (2), 465-471.
13. Wei, M.; Fang, L.; Lee, J.; Somu, S.; Xiong, X.; Barry, C.; Busnaina, A.; Mead, J., Directed Assembly of Polymer Blends Using Nanopatterned Templates. *Advanced Materials* 2009, 21 (7), 794-798.
14. Busnaina, A.; Mead, J. L.; Barry, C. M. F.; Wei, M. Patterned Nanosubstrates Made by Directed Self Assembly of Amphiphilic Molecules. US2010311613 (A1), 2010/12/09/, 2010.
15. Born, P.; Blum, S.; Munoz, A.; Kraus, T., Role of the Meniscus Shape in Large-Area Convective Particle Assembly. *Langmuir* 2011, 27(14), 8621-8633.
16. Zhong, X.; Crivoi, A.; Duan, F., Sessile nanofluid droplet drying. *Advances in Colloid and Interface Science* 2015, 217, 13-30.

The invention claimed is:

1. A method of assembling nanoelements on a substrate to form a nanoscale or microscale pattern of nanoelements, the method comprising the steps of:
   (a) providing a suspension of nanoelements in a liquid and a substrate comprising one or more hydrophobic regions disposed on a surface of the substrate and one or more hydrophilic regions disposed between the hydrophobic regions on the surface of the substrate, the hydrophilic regions forming a nanoscale or microscale pattern;
   (b) dipping the substrate into the nanoelement suspension so that the pattern of hydrophilic regions is submerged in the suspension; and
   (c) withdrawing the substrate out of the suspension and into air or gas above the suspension at a speed that allows evaporation of the liquid but not draining of the suspension, whereby nanoelements from the suspension bind selectively to the hydrophilic regions to form said nanoscale or microscale pattern of nanoelements.

2. The method of claim 1, further comprising drying and/or annealing the assembled nanoelements after step (c).

3. The method of claim 1, wherein the substrate is rigid or flexible.

4. The method of claim 1, wherein the nanoelements are conducting, semi-conducting, or insulating, and wherein the nanoelements comprise inorganic or organic material.

5. The method of claim 1, wherein the hydrophobic regions comprise a self-assembled monolayer of molecules, such as a silane compound, that provide a hydrophobic coating that defines the hydrophobic regions.

6. The method of claim 1, wherein the hydrophilic regions are rendered hydrophilic by exposure of the substrate to an oxygen plasma.

7. The method of claim 1, further comprising:
   (d) rendering one or more of the hydrophobic regions hydrophilic;
   (e) forming new hydrophobic regions on an upper surface of the substrate containing said nanoscale or microscale pattern of nanoelements, and new hydrophilic regions disposed between the new hydrophobic regions, the new hydrophilic regions forming a new nanoscale or microscale pattern; and
   (f) repeating steps (b) and (c) of claim 1 to form a new nanoscale or microscale pattern of nanoelements.

8. The method of claim 7, wherein step (d) comprises plasma treatment, heat treatment, or chemical treatment of the substrate.

9. The method of claim 7, wherein step (f) is performed using a nanoelement suspension that comprises nanoelements that are the same as or different from the nanoelements contained in the previously used nanoelement suspension.

10. The method of claim 1, wherein the substrate comprises silicon, silicon dioxide, or sapphire.

11. The method of claim 1, wherein the withdrawal speed is in the range of about 10 mm/min to about 100 mm/min.

12. The method of claim 1, wherein the nanoelement suspension has a surface tension of about 60 to about 75 mN/m, preferably about 70 mN/m.

13. The method of claim 1, wherein the nanoelement suspension comprises nanoelements selected from the group consisting of nanoparticles and carbon nanotubes.

14. A device comprising a patterned nanoscale or microscale assembly of nanoelements, wherein the device is fabricated by a method comprising the method of claim 1.

15. A method of preparing a patterned substrate for fast fluidic assembly of nanoelements on the substrate into a nanoscale or microscale pattern, the method comprising the steps of:
   (a) treating a surface of the substrate with a plasma, whereby the surface is rendered hydrophilic or more hydrophilic;
   (b) depositing a photoresist on the plasma treated surface;
   (c) performing lithography such that a pattern of photoresist structures remains, said pattern of photoresist structures corresponds to said nanoscale or microscale pattern;
   (d) forming a patterned hydrophobic coating in areas between the photoresist structures remaining after step (c);

(e) removing the photoresist structures, leaving hydrophilic regions between areas of hydrophobic coating, thereby forming said patterned substrate.

16. The method of claim 15, wherein the pattern of hydrophobic coating is formed in step (d) by forming a self-assembled monolayer of molecules, such as a silane compound, that provide hydrophobicity to the hydrophobic coating.

17. The method of claim 16, further comprising performing the method of claim 1 to form a nanoscale or microscale pattern of assembled nanoelements on the patterned substrate.

18. A patterned substrate for use in fast fluidic assembly of nanoelements, wherein the patterned substrate is obtainable by the method of claim 15.

19. The patterned substrate of claim 18, further comprising a patterned assembly of nanoelements.

\* \* \* \* \*